United States Patent
Wu

(10) Patent No.: US 6,710,396 B1
(45) Date of Patent: Mar. 23, 2004

(54) SELF-ALIGNED SPLIT-GATE FLASH CELL STRUCTURE AND ITS CONTACTLESS FLASH MEMORY ARRAYS

(75) Inventor: Ching-Yuan Wu, Hsinchu (TW)

(73) Assignee: Silicon-Based Technology Corp., Hsinchu (TW)

(*) Notice: Subject to any disclaimer, the term of this patent is extended or adjusted under 35 U.S.C. 154(b) by 16 days.

(21) Appl. No.: 10/351,236

(22) Filed: Jan. 24, 2003

(51) Int. Cl.[7] .............................................. H01L 29/788
(52) U.S. Cl. ....................... 257/315; 257/314; 257/321; 257/339
(58) Field of Search ................................. 257/314, 315, 257/321, 339

(56) References Cited

U.S. PATENT DOCUMENTS

| | | | |
|---|---|---|---|
| 6,433,384 B1 * | 8/2002 | Hashimoto | 257/316 |
| 6,436,764 B1 * | 8/2002 | Hsieh | 438/257 |
| 6,462,375 B1 * | 10/2002 | Wu | 257/316 |
| 6,531,734 B1 * | 3/2003 | Wu | 257/315 |
| 6,570,231 B1 * | 5/2003 | Yasumi et al. | 257/384 |

* cited by examiner

Primary Examiner—David Nelms
Assistant Examiner—Dao H Nguyen
(74) Attorney, Agent, or Firm—Pro-Techtor International Services

(57) ABSTRACT

A self-aligned split-gate flash cell structure of the present invention comprises a ridge-shaped floating-gate layer being formed on a first gate dielectric layer with a first intergate dielectric layer being formed on its top portion and a second intergate dielectric layer being formed on its inner sidewall; a control/select-gate conductive layer being formed at least over a second gate dielectric layer and the first/second intergate dielectric layers; and a common-source diffusion region and a common-drain diffusion region being implanted by aligning to the control/select-gate conductive layer. The self-aligned split-gate flash cell structure is configured into two contactless array architectures: a contactless NOR-type flash memory array and a contactless parallel common-source/drain conductive bit-lines flash memory array.

20 Claims, 10 Drawing Sheets

SELF-ALIGNED SPLIT-GATE FLASH CELL STRUCTURE AND ITS CONTACTLESS FLASH MEMORY ARRAYS

FIELD OF THE INVENTION

The present invention relates to a split-gate flash memory cell and its flash memory array and, more particularly, to a self-aligned split-gate flash cell structure having a ridge-shaped floating-gate layer and its contactless flash memory arrays.

DESCRIPTION OF THE RELATED ART

A split-gate flash cell structure having a select-gate region and a floating-gate region offers in general a larger cell size as compared to that of a stack-gate cell structure and is usually configured to be a NOR-type flash memory array.

FIG. 1 shows a conventional split-gate flash memory device having a floating-gate layer 211 formed by a local oxidation of silicon (LOCOS) technique, in which the floating-gate length is defined in general to be larger than a minimum feature size (F) of technology used due to a bird's beak formation; a control-gate layer 215 is formed over a LOCOS-oxide layer 212 and a thicker select-gate oxide layer 214; a poly-oxide layer 213 is formed over a sidewall of the floating-gate layer 211; a source diffusion region 216 and a drain diffusion region 217 are formed in a semiconductor substrate 200 in a self-aligned manier, and a thin gate-oxide layer 210 is formed under the floating-gate layer 211. The split-gate flash cell structure shown in FIG. 1 is programmed by mid-channel hot-electron injection, the programming efficiency is high and the programming power is low as compared to channel hot-electron injection (CHEI) used in a stack-gate flash cell structure. Moreover, the over-erase problem of the split-gate flash cell structure can be prevented due to a high threshold-voltage for the select-gate region, so the control logic circuits for erasing and verification can be simplified. However, there are several drawbacks for FIG. 1: the cell size is much larger due to the non-self-aligned control-gate structure; the control-gate length can't be easily scaled down due to the misalignment of the control-gate layer 215 with respect to the floating-gate layer 211; the coupling ratio is low and a higher applied control-gate voltage is required for erase; the field-emission tip of the floating-gate layer 211 is difficult to be controlled due to the weak masking ability of the bird-beak oxide; and a high temperature process is required to form a thicker LOCOS-oxide layer 212 in order to obtain an appreciate tip.

It is therefore a major objective of the present invention to provide a simple low-temperature process for forming a ridge-shaped floating-gate layer for a self-aligned split-gate flash cell structure with a higher field-emission efficiency.

It is another objective of the present invention to provide a self-aligned split-gate flash cell structure having a scalable cell size equal to or smaller than $4F^2$.

It is a further objective of the present invention to provide a higher coupling ratio for a self-aligned split-gate flash cell structure.

It is yet another objective of the present invention to provide two contactless architectures for self-aligned split-gate flash memory arrays.

Other objectives and advantages of the present invention will be more apparent from the following description.

SUMMARY OF THE INVENTION

A self-aligned split-gate flash cell structure of the present invention is formed on a semiconductor substrate of a first conductivity type having an active region isolated by two parallel shallow trench isolation (STI) regions. A cell region can be divided into three regions: a common-source region, a self-aligned split-gate region, and a common-drain region, wherein the self-aligned split-gate region is located between the common-source region and the common-drain region. The common-source region comprises a first sidewall dielectric spacer being formed over a first sidewall of the self-aligned split-gate region and on a portion of a first flat bed being formed by a common-source diffusion region of a second conductivity type in the active region and two third raised field-oxide layers in the two parallel STI regions. The common-drain region comprises a second sidewall dielectric spacer being formed over a second sidewall of the self-aligned split-gate region and on a portion of a second flat bed being formed by a common-drain diffusion region of the second conductivity type in the active region and two fifth raised field-oxide layers in the two parallel STI regions. The self-aligned split-gate region comprises a ridge-shaped floating-gate structure being formed on a first gate dielectric layer in a floating-gate region with a first intergate dielectric layer being formed on its top portion and a second intergate dielectric layer being formed on its inner sidewall; and a control/select-gate conductive layer being formed at least over a second gate dielectric layer in the select-gate region and the first/second intergate dielectric layers in the floating-gate region and a portion of the first raised/planarized field-oxide layers in the two parallel STI regions, wherein the ridge-shaped floating-gate layer is formed by anisotropic dry etching to have a single-side tapered structure and its ridge-shaped tip is defined by a buffer sidewall dielectric spacer.

The self-aligned split-gate flash cell structure of the present invention as described is used to implement two contactless flash memory array architectures: a contactless NOR-type flash memory array and a contactless parallel common-source/drain conductive bit-lines flash memory array. The contactless NOR-type flash memory array comprises a plurality of common-source conductive bus lines being formed alternately in the common-source regions and transversely to a plurality of active regions and a plurality of parallel STI regions; a plurality of common-drain conductive islands being at least formed over the plurality of active regions along each of the common-drain regions and being located between the plurality of common-source conductive bus lines; a plurality of self-aligned split-gate flash cell structures being formed between each of the plurality of common-source conductive bus lines and its nearby common-drain conductive islands with the control/select-gate conductive layer being acted as a word line; and a plurality of metal bit-lines integrated with the plurality of common-drain conductive islands being simultaneously patterned and etched by using a plurality of hard masking layers. Each of the plurality of hard masking layers includes a masking dielectric layer being aligned to each of the active regions and a sidewall dielectric spacer being formed over each sidewall of the masking dielectric layers.

The contactless parallel common-source/drain conductive bit-lines flash memory array of the present invention comprises a plurality of common-source conductive bit lines and a plurality of common drain conductive bit lines being formed alternately and transversely to a plurality of active regions and a plurality of parallel STI regions; a plurality of self-aligned split-gate flash cell structure being formed between each of the plurality of common-source conductive bit lines and each of the plurality of common-drain conductive bit lines; and a plurality of metal word lines integrated with a plurality of planarized control/select-gate conductive islands being simultaneously patterned and etched to be perpendicular to the plurality of common-source/drain conductive bit lines by using a plurality of hard masking layers. Each of the plurality of hard masking layers includes a masking dielectric layer being aligned to each of the active regions and a sidewall dielectric spacer being formed over each sidewall of the masking dielectric layers.

BRIEF DESCRIPTION OF THE DRAWINGS

FIG. 4A through FIG. 4E show a schematic top plan view and various cross-sectional views of a self-aligned split-gate flash cell structure and its contactless NOR-type flash memory array of the present invention, in which FIG. 4A shows a top plan view; FIG. 4B shows a cross-sectional view along a B–B' line indicated in FIG. 4A; FIG. 4C shows a cross-sectional view along a C–C' line indicated in FIG. 4A; FIG. 4D shows a cross-sectional view along a D–D' line indicated in FIG. 4A; and FIG. 4E shows a cross-sectional view along a E–E' line indicated in FIG. 4A.

FIG. 6A through FIG. 6E show a schematic top plan view and various cross-sectional views of a self-aligned split-gate flash cell structure and its contactless parallel common-source/drain conductive bit-lines array of the present invention, in which FIG. 6A shows a top plan view; FIG. 6B shows a cross-sectional view along a B–B' line indicated in FIG. 6A; FIG. 6C shows a cross-sectional view along a C–C' line indicated in FIG. 6A; FIG. 6D shows a cross-sectional view along a D–D' line indicated in FIG. 6A; and FIG. 6E shows a cross-sectional view along a E–E' line indicated in FIG. 6A.

DETAILED DESCRIPTION OF THE PREFERRED EMBODIMENTS

Figure 1:
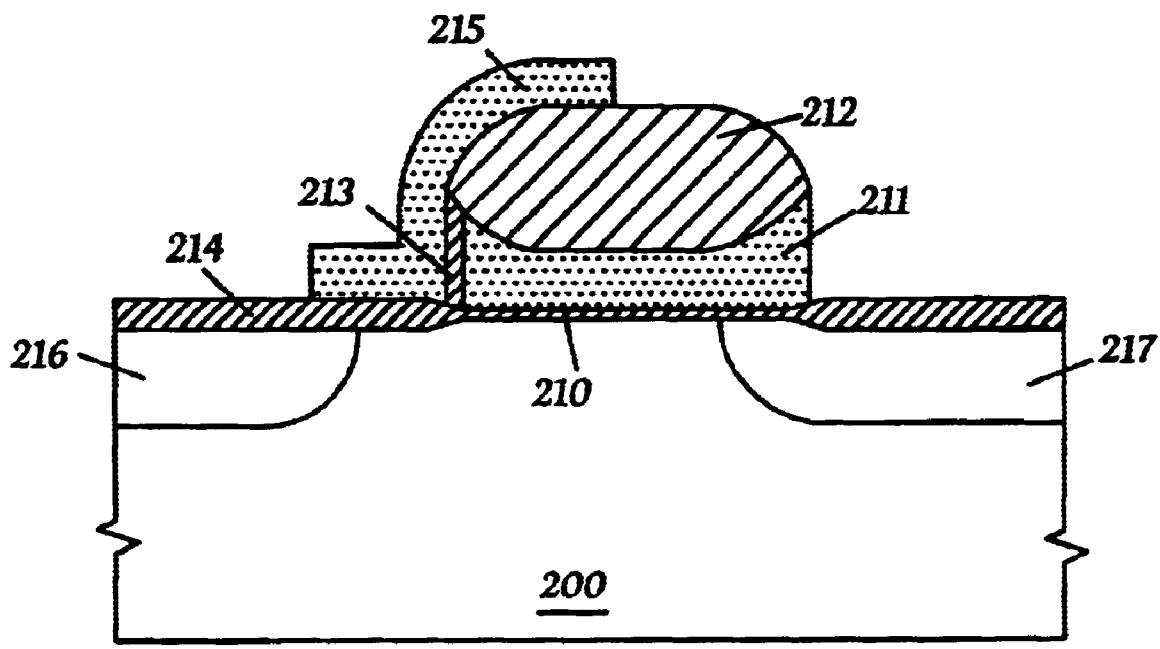
FIG. 1 shows a cross-sectional view of a conventional split-gate flash cell structure with a tip-cathode structure being formed by LOCOS technique.
Figure 2A:
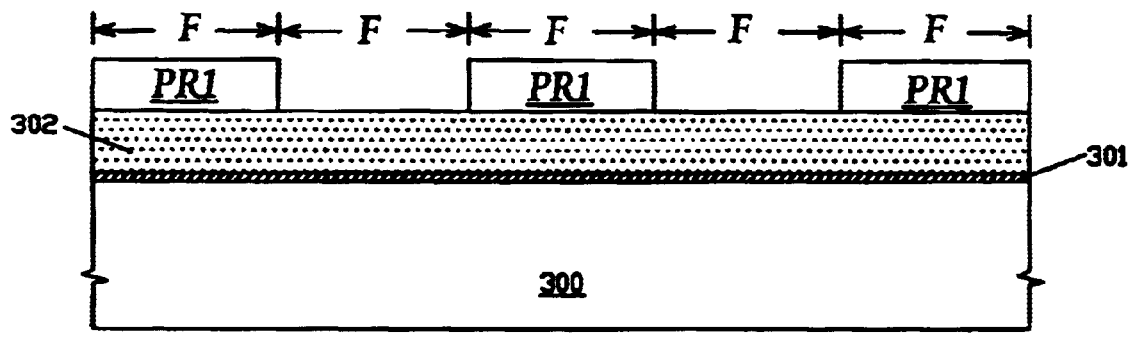
FIG. 2A through FIG. 2C show the process steps and their cross-sectional views of forming a shallow trench isolation structure for a self-aligned split-gate flash cell structure and its contactless flash memory arrays of the present invention.
Figure 2B:
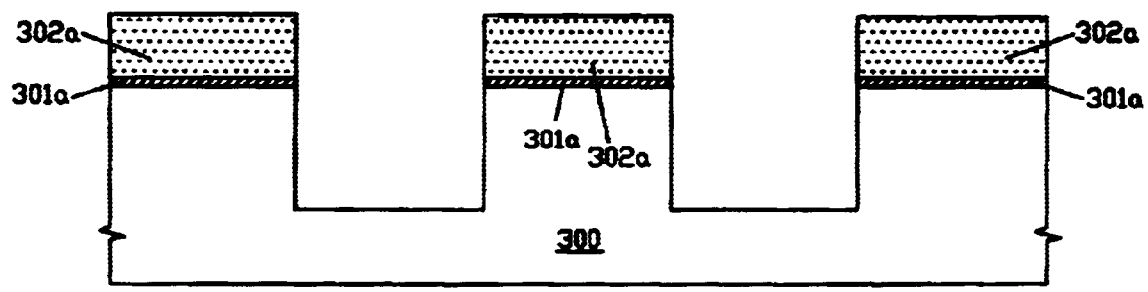
Figure 2C:
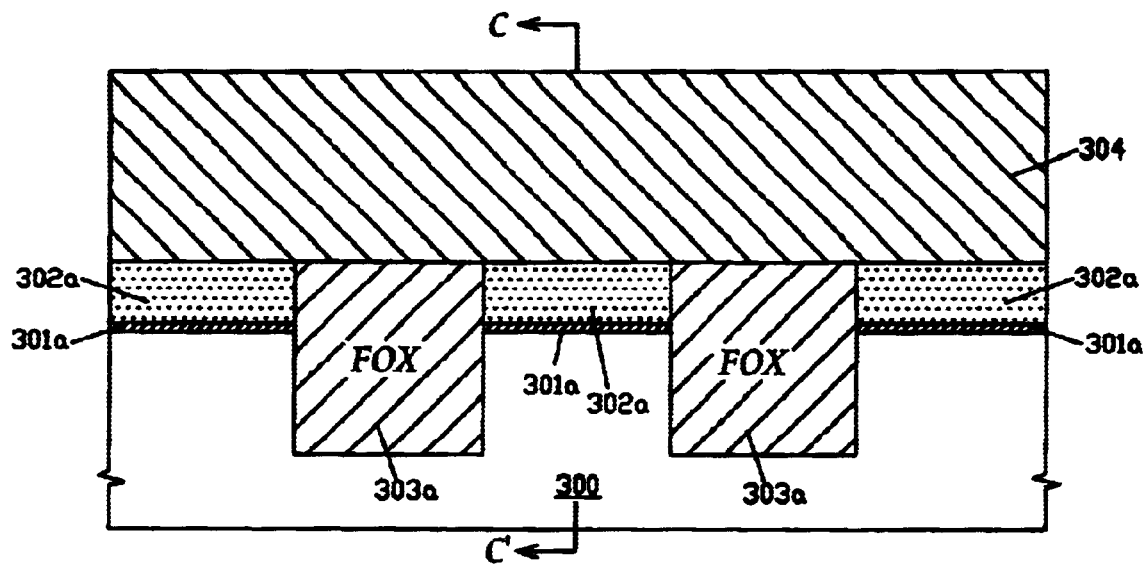

Referring now to FIG. 2A through FIG. 2C, there are shown the process steps and their cross-sectional views of fabricating a shallow trench isolation (STI) structure for a self-aligned split-gate flash cell structure and its contactless flash memory arrays of the present invention.

FIG. 2A shows that a first gate dielectric layer 301 is formed on a semiconductor substrate 300 of a first conductivity type; a first conductive layer 302 is formed on the first gate dielectric layer 301; and a plurality of masking photoresist PR1 are formed over the first conductive layer 302 to define a plurality of active regions (AA's) (under PR1) and a plurality of parallel shallow trench isolation regions (STI lines) (between PR1). The first gate dielectric layer 301 is preferably a thermal oxide layer or a nitrided thermal oxide layer and its thickness is preferably between 60 Angstroms and 120 Angstroms. The first conductive layer 302 is preferably made of doped polycrystalline silicon or doped amorphous silicon as deposited by low-pressure chemical vapor deposition (LPCVD) and its thickness is preferably between 1000 Angstroms and 5000 Angstroms. It should be noted that the width and the space of each of the plurality of masking photoresist PR1 can be defined to be a minimum feature size (F) of technology used, as indicated in FIG. 2A.

FIG. 2B shows that the first conductive layer 302 and the first gate dielectric layer 301 between the plurality of masking photoresist PR1 are sequentially removed by using anisotropic dry etching and the semiconductor substrate 300 is then anisotropically etched to form shallow trenches; and subsequently, the plurality of masking photoresist PR1 are stripped. The depth of shallow trenches in the semiconductor substrate 300 is preferably between 3000 Angstroms and 8000 Angstroms.

FIG. 2C shows that a planarized field-oxide layer 303a is formed to fill each gap shown in FIG. 2B. The planarized field-oxide layer 303a is preferably made of silicon dioxide, phosphosilicate glass (PSG), or boro-phosphosilicate glass (BPSG), as deposited by LPCVD, high-density plasma (HDP) CVD, or plasma-enhanced (PE) CVD and is formed by first depositing a thick silicon dioxide film 303 to fill each gap and then planarizing the deposited thick silicon dioxide film 303 using chemical-mechanical polishing (CMP) with the patterned first conductive layer 302a as a polishing stop.

FIG. 2C also shows that a first masking dielectric layer 304 is formed over a flat surface being alternately formed by the planarized field-oxide layer 303a and the patterned first conductive layer 302a. The first masking dielectric layer 304 is preferably made of silicon nitride as deposited by LPCVD and its thickness is preferably between 4000 Angstroms and 12000 Angstroms. The cross-sectional view along an active region (AA) as marked by a C–C' line in FIG. 2C is shown in FIG. 3A.

Referring now to FIG. 3A through FIG. 3L, there are shown the process steps and their cross-sectional views of fabricating a self-aligned split-gate flash cell structure and its contactless NOR-type flash memory array of the present invention.

Figure 3A:
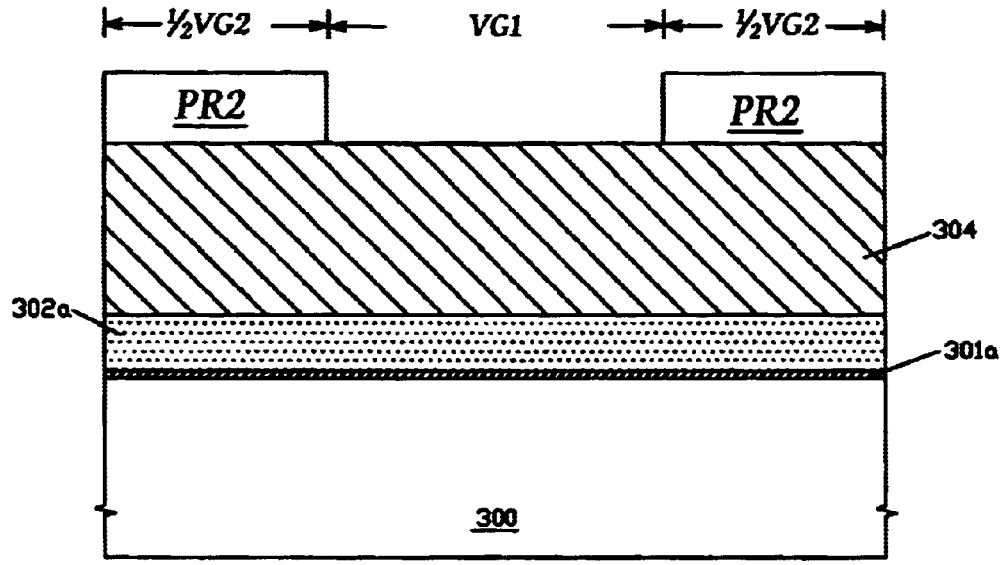
FIG. 3A through FIG. 3L show the process steps and their cross-sectional views of forming a self-aligned split-gate flash cell structure and its contactless NOR-type flash memory array of the present invention.

FIG. 3A shows only a small portion of a memory array, in which a plurality of masking photoresist PR2 are formed over the first masking dielectric layer 304 to define a plurality of fist virtual-gate regions VG1 (between PR2) and a plurality of second virtual-gate regions VG2 (under PR2). Each of the plurality of first virtual-gate regions (VG1) includes a common-drain region and a pair of floating-gate regions. Each of the plurality of second virtual-gate regions (VG2) includes a common-source region and a pair of select-gate regions. It should be noted that both the first virtual-gate region (VG1) and the second virtual-gate region (VG2) are scalable.

Figure 3B:
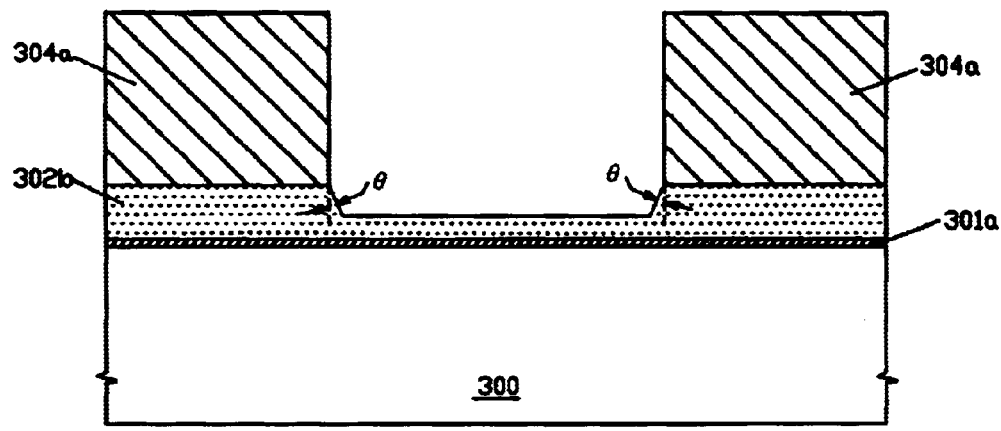

FIG. 3B shows that the first masking dielectric layers 304 between the plurality of masking photoresist PR2 are selectively removed; the planarized field-oxide layers 303a as shown in FIG. 2C in the plurality of parallel STI regions are etched back to form first raised field-oxide layers 303b (see FIG. 4D); the patterned first conductive layer 302a in each of the first virtual-gate regions is etched to have an inclined angle θ by using anisotropic dry etching; and the plurality of masking photoresist PR2 are then stripped. The etching depth of the planarized field-oxide layer 303a and the patterned first conductive layer 302a is preferably the same and is approximately between 500 Angstroms and 1500 Angstroms and the inclined angle θ is preferably between 10 degrees and 30 degrees.

Figure 3C:
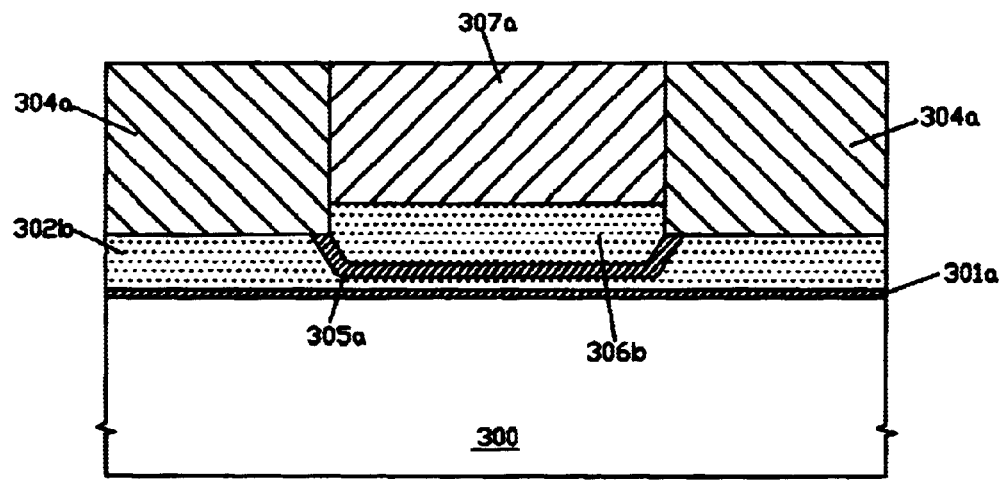

FIG. 3C shows that a first intergate dielectric layer 305a is formed over each of the shaped first conductive layer 302b shown in FIG. 3B. It should be emphasized that the first intergate dielectric layer 305a is preferably a thermal poly-oxide or nitrided thermal poly-oxide layer and its thickness is preferably between 150 Angstroms and 300 Angstroms. FIG. 3C also shows that a planarized second conductive layer 306a is formed over the first intergate dielectric layer 305a and is then etched back to form an etched-back second conductive layer 306b. The planarized second conductive layer 306a is preferably made of doped polycrystalline silicon or doped amorphous silicon as deposited by LPCVD and is formed by first depositing a thick second conductive layer 306 to fill each gap and then planarizing the deposited thick second conductive layer 306 using CMP with the patterned first masking dielectric layer 304a as a polishing stop. It should be noted that a metal-silicide layer (not shown) can be formed over the etched-back second conductive layer 306b in each of the first virtual-gate regions (VG1) by using a deposition technique as described for the etched-back second conductive layer 306b and is preferably a tungsten disilicide (WSi$_2$) or tungsten (W) layer. FIG. 3C further shows that a planarized capping oxide layer 307a is formed over each gap in the first virtual-gate regions (VG1) by first depositing a thick silicon dioxide film 307 to fill each gap and then planarizing the deposited thick silicon dioxide film 307 using CMP with the patterned first masking dielectric layer 304a as a polishing stop.

Figure 3D:
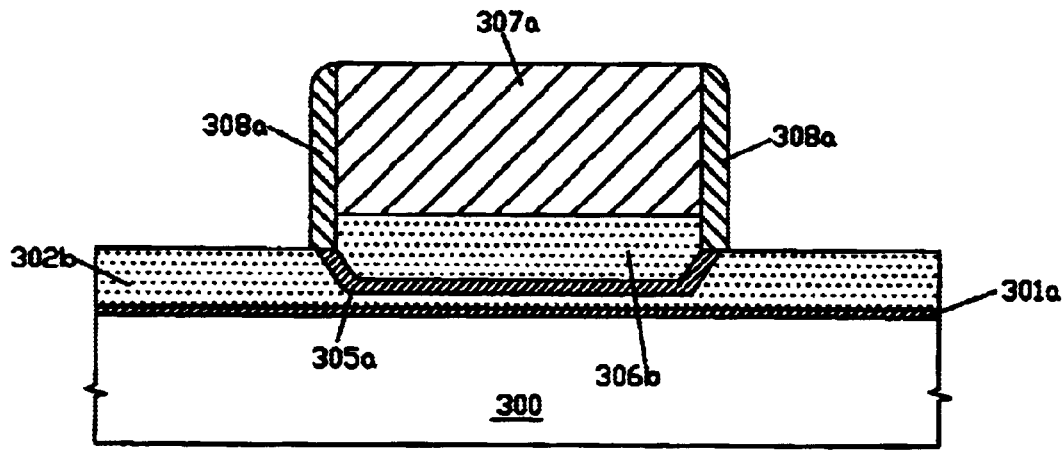

FIG. 3D shows that the patterned second masking dielectric layers 304a in each of the second virtual-gate regions (VG2) are removed by hot-phosphoric acid or anisotropic dry etching and a buffer sidewall dielectric spacer 308a is formed over each sidewall formed by the removed patterned second masking dielectric layer 304a in each of the second virtual-gate regions (VG2). The buffer sidewall dielectric spacer 308a is preferably made of silicon nitride as deposited by LPCVD and its spacer width is mainly used to create a buffer region for sidewall oxidation of the patterned first conductive layer 302c (see FIG. 3E) later on. It is clearly seen that the buffer sidewall dielectric spacer 308a offers two purposes: one is to prevent the ridge-shaped tip from damages due to anisotropic dry etching; the other is to offer a buffer region for sidewall oxidation without smearing out the sharp shape of the tip cathode. As a consequence, a reproducible tip cathode with a higher field-emission efficiency can be easily obtained by the present invention.

Figure 3E:
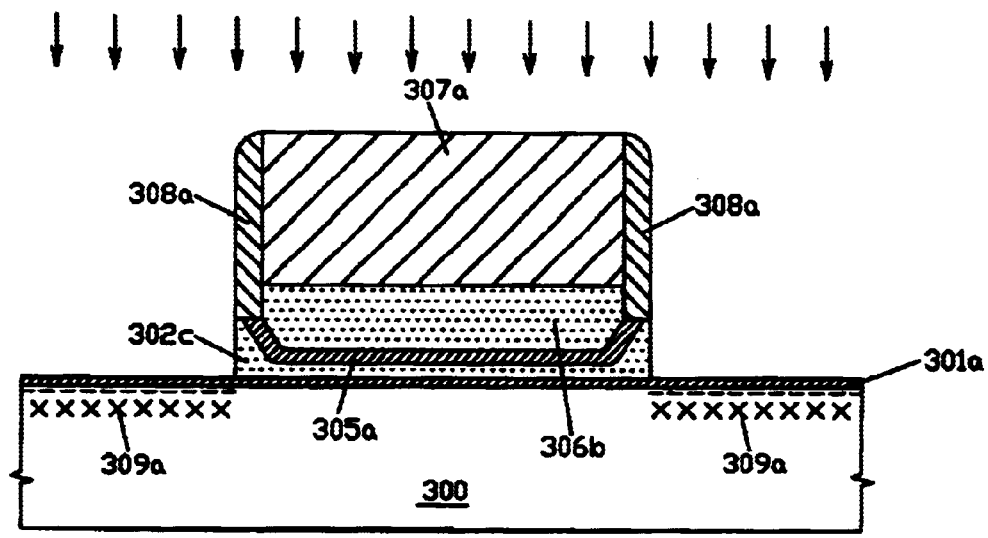

FIG. 3E shows that the patterned first conductive layer 302b between the pair of buffer sidewall dielectric spacers 308a in each of the second virtual-gate regions (VG2) is removed by using anisotropic dry etching. An ion-implantation is then performed in a self-aligned manner to form an implanted region 309a of a first conductivity type in a surface region of the semiconductor substrate 300 in each of the plurality of active regions, in which the implanted region 309a may comprise a shallow implant region as indicated by a dashed line for threshold-voltage adjustment and a deep implant region as indicated by the cross symbols for forming a punch-through stop.

Figure 3F:
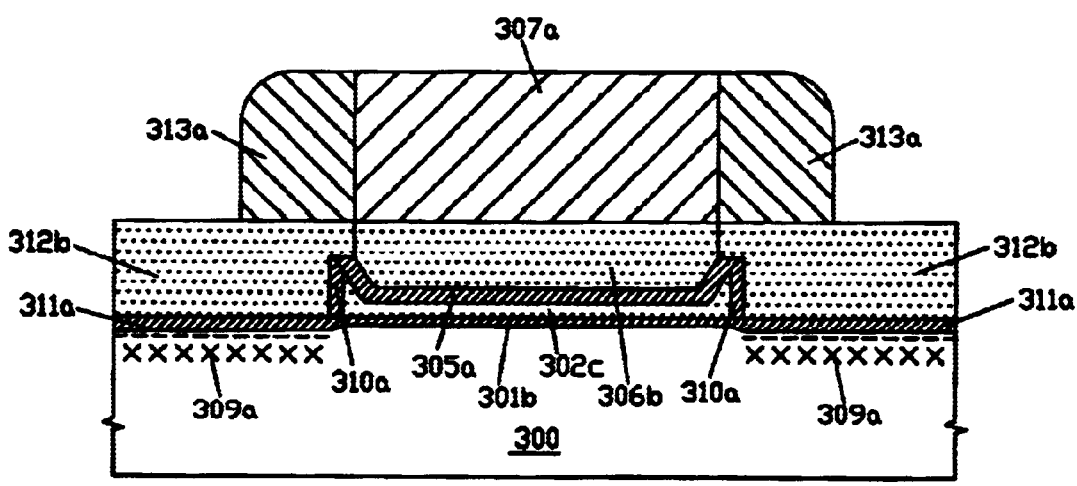

FIG. 3F shows that a thermal oxidation process is then performed to form a second gate dielectric layer 311a over the semiconductor substrate 300 in each of the plurality of active regions (AA's) and a second intergate dielectric layer 310a over each sidewall of the patterned first conductive layer 302c; and the buffer sidewall dielectric spacers 308a are then removed by using hot-phosphoric acid. It is clearly seen that the second intergate dielectric layer 310a is formed over the tip cathode in a cross-over manner and a higher field-emission efficiency of the tipcathode of the present invention is expected. Moreover, a thermal nitridation process can be performed in a N$_2$O or NH$_3$ ambient to nitride the second intergate dielectric layers 310a and the second gate dielectric layers 311a before removing the buffer sidewall dielectric spacers 308a for increasing the endurance of the second intergate dielectric layer 310a over the tip-cathode. FIG. 3F also shows that a planarized third conductive layer 312a is formed over each gap in the second virtual-gate regions (VG2) and is etched back to a depth equal to a thickness of the planarized capping oxide layer 307a to form an etched-back third conductive layer 312b. The etched-back third conductive layer 312b is preferably made of doped polycrystalline silicon or doped amorphous silicon as deposited by LPCVD. Similarly, the etched-back third conductive layer 312b can be a composite conductive layer such as a tungsten disilicide layer over a doped polycrystalline silicon or amorphous silicon layer as described for the etched-back second conductive layer 306b. FIG. 3F further shows that a third sidewall dielectric spacer 313a is formed over each sidewall of the planarized capping oxide layer 307a and on a portion of the etched-back third conductive layer 312b to define the width of the select-gate region in each of the second virtual-gate regions (VG2).

Figure 3G:
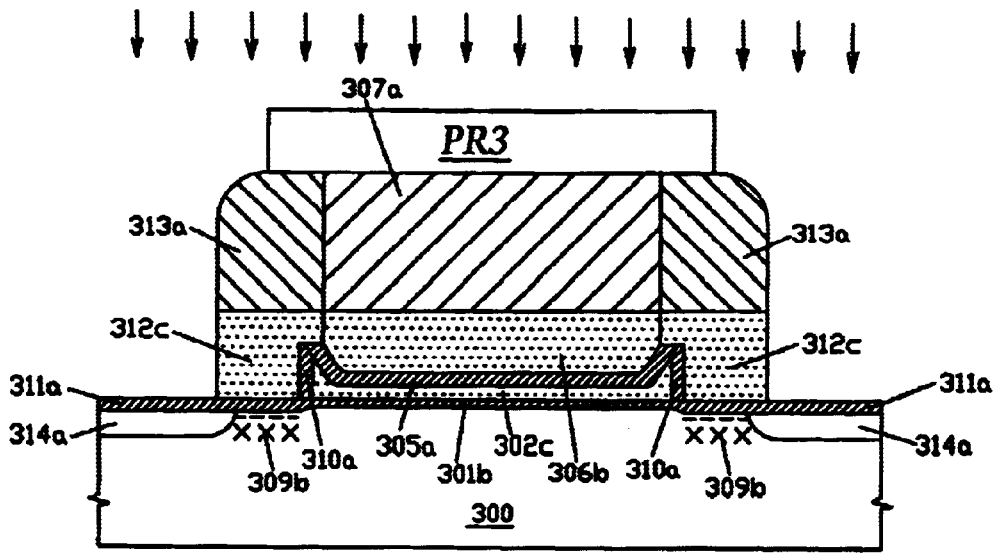

FIG. 3G shows that a plurality of masking photoresist PR3 are formed over the planarized capping oxide layers 307a and a portion of nearby third sidewall dielectric spacers 313a; the etched-back third conductive layers 312b are etched back first to approximately equal to a top surface of the planarized field-oxide layers 303a, then the planarized field-oxide layers 303a in each of the plurality of parallel STI regions are then anisotropically etched back to a top surface of the second gate dielectric layer 311a to form second raised field-oxide layers 303c; and subsequently, the remained etched-back third conductive layers 312b are anisotropically removed to form a first flat surface being alternately formed by the second gate dielectric layer 311a and the second raised field-oxide layer 303c in each of the common-source regions. An ion-implantation is performed in a self-aligned manner by implanting doping impurities across the second gate dielectric layer 311a into the semiconductor substrate 300 in the active regions to form the common-source diffusion regions 314a of a second conductivity type. The common-source diffusion regions 314a can be lightly doped, moderately doped, or heavily doped.

Figure 3H:
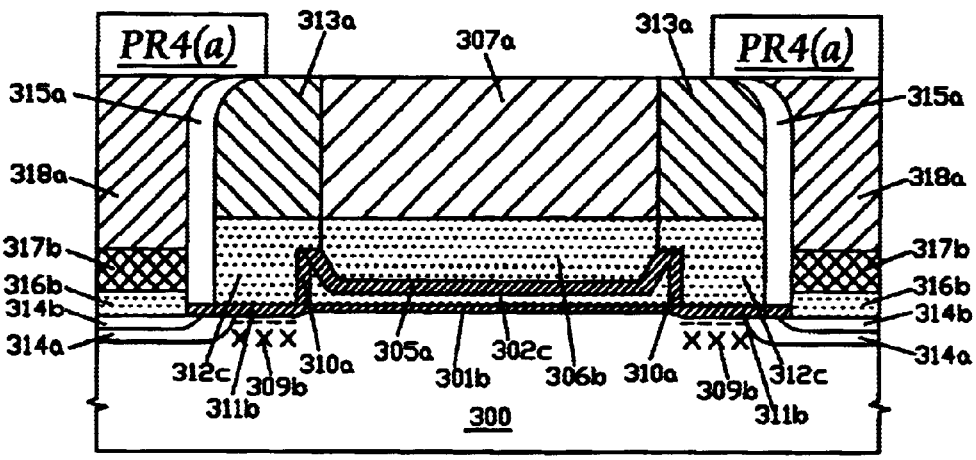

FIG. 3H shows that the plurality of masking photoresist PR3 are removed and a pair of first sidewall dielectric spacers 315a are formed over each sidewall of the common-source regions and on a portion of the first flat surface; an ion-implantation process can be performed in a self-aligned manner by implanting a high dose of doping impurities across the second gate dielectric layers 311a into the semiconductor substrate 300 in the active regions (AA) to form a shallow heavily-doped common-source diffusion region 314b of the second conductivity type within each of the common-source diffusion regions 314a; the second gate dielectric layers 311a between the pair of first sidewall dielectric spacers 315a in each of the common-source regions are removed by dipping in a dilute hydrofluoric-acid solution or using anisotropic dry etching and the second raised field-oxide layer 303c in each of the plurality of parallel STI regions is simultaneously etched to form a first flat bed along each of the common-source regions. The first flat bed is formed alternately by the shallow heavily-doped common-source diffusion region 314b and a third raised field-oxide layer 303d (see FIG. 4B). FIG. 3H also shows that a common-source conductive bus line 317b/316b is formed over the first flat bed between the pair of first sidewall dielectric spacers 315a in each of the common-source regions; and a first planarized thick-oxide layer 318a is formed over each of the common-source conductive bus lines 317b/316b and the pair of first sidewall dielectric spacers 315a. The first sidewall dielectric spacer 315a is preferably made of silicon nitride or silicon dioxide as deposited by LPCVD. The common-source conductive layer 316b is preferably made of doped polycrystalline-silicon as deposited by LPCVD and is formed by first depositing a thick fourth conductive layer 316 over each gap between the pair of first sidewall dielectric spacers 315a and then planarizing the deposited thick fourth conductive layer 316 using CMP with the third sidewall dielectric spacers 313a as a polishing stop; and subsequently, etching back the planarized fourth conductive layer 316a. The common-source capping conductive layer 317b can be a tungsten disilicide ($WSi_2$) or tungsten (W) layer, in which the tungsten disilicide or tungsten layer 317b is formed by a deposition technique similar to that of the common-source conductive layer 316b. It should be noted that the doped polycrystalline silicon layer 316b can be further implanted with a high dose of doping impurities to act as a dopant diffusion source for forming a shallow heavily-doped common-source diffusion region 314b of the second conductivity type within each of the common-source diffusion regions 314a. The first planarized thick-oxide layer 318a is preferably made of silicon dioxide, phosphosilicate glass (P-glass), or borophosphosilicate glass (BP-glass), as deposited by LPCVD, high-density plasma (HDP) CVD, or (PE) CVD. Similarly, the first planarized thick-oxide layer 318a is formed by first depositing a thick-oxide film 318 over the formed structure and then planarizing the deposited thick-oxide film 318 using CMP with the third sidewall dielectric spacer 313a as a polishing stop. FIG. 3H further shows that a plurality of masking photoresist PR4(a) is formed over each of the common-source regions and a portion of nearby third sidewall dielectric spacers 313a.

Figure 3I:
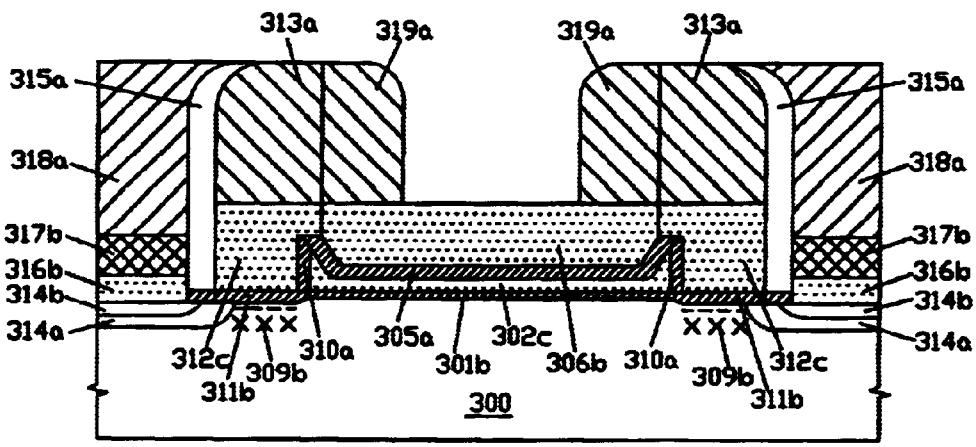

FIG. 3I shows that the planarized capping oxide layers 307a are selectively removed by using a buffered hydrofluoric-acid solution or anisotropic dry etching, then the plurality of masking photoresist PR4(a) are stripped. Subsequently, a fourth sidewall dielectric spacer 319a is formed over each sidewall in each of the first virtual-gate regions VG1 and on a portion of the etched-back second conductive layer 306b to define the width of the floating-gate region.

Figure 3J:
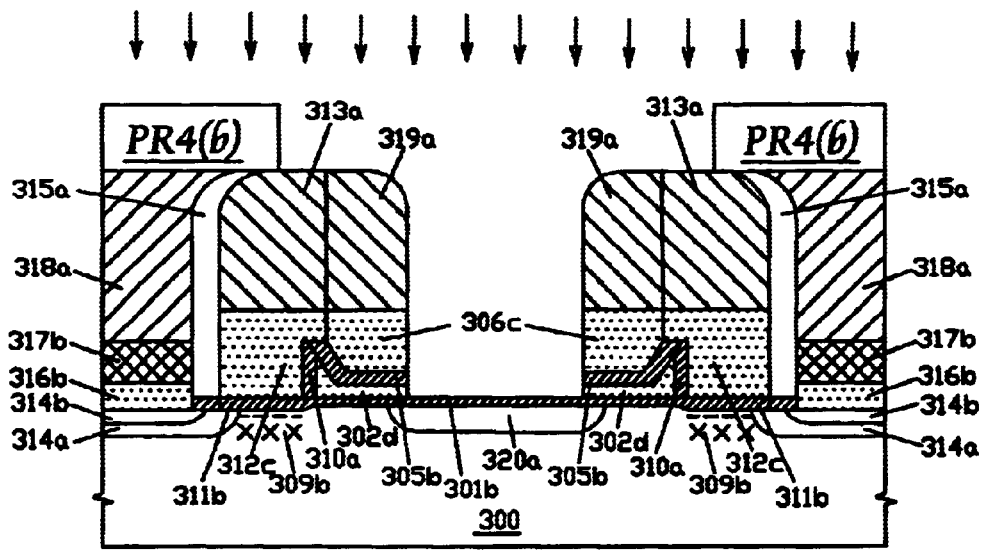

FIG. 3J shows that a plurality of masking photoresist PR4(b) are again formed over the same position; the etched-back second conductive layer 306b and the first intergate dielectric layer 305a between the pair of fourth sidewall dielectric spacers 319a are sequentially removed and the first raised field-oxide layers 303b are then etched back to a level equal to a top surface of the first gate dielectric layer 301b; and subsequently, the patterned first conductive layers 302c are removed in a self-aligned manner by using anisotropic dry etching to form a second flat surface being alternately formed by the first gate dielectric layer 301b and a fourth raised field-oxide layer 303e in each of the common-drain regions; and an ion-implantation is performed in a self-aligned manner to form a common-drain diffusion region 320a of the second conductivity type in a surface portion of the semiconductor substrate 300 in each of the plurality of active regions along each of the common-drain regions. The common-drain diffusion region 320a can be lightly doped, moderately doped, or heavily doped.

Figure 3K:
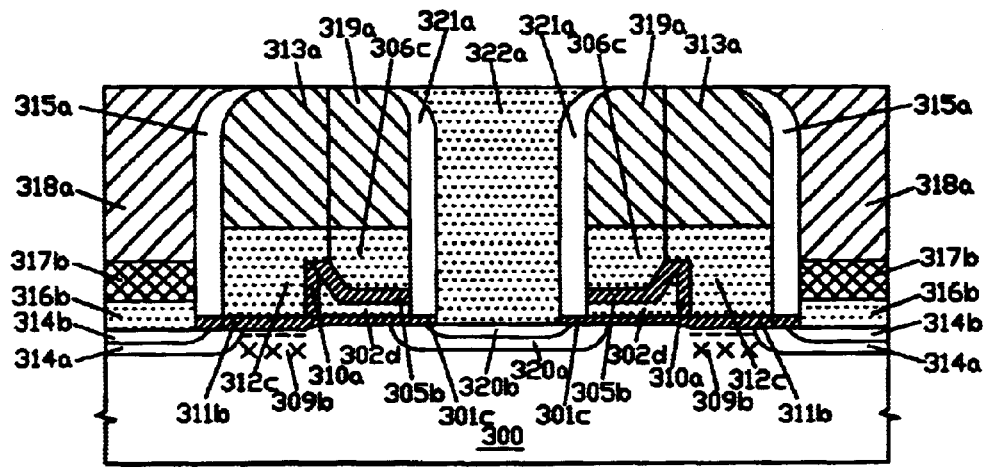

FIG. 3K shows that the plurality of masking photoresist PR4(b) are removed; a second sidewall dielectric spacer 321a is formed over each sidewall of the common-drain regions and on a portion of the second flat surface; and an ion-implantation process is performed in a self-aligned manner by implanting a high dose of doping impurities across the first gate dielectric layer 301b into surface portions of the semiconductor substrate 300 in the active regions to form a shallow heavily-doped common-drain diffusion region 320b of the second conductivity type within each of the common-drain diffusion regions 320a. The second sidewall dielectric spacer 321a is preferably made of silicon nitride or silicon oxide as deposited by LPCVD.

FIG. 3K also shows that the first gate dielectric layers 301b between the pair of second sidewall dielectric spacers 321a are removed by dipping in a dilute hydrofluoric acid solution or using anisotropic dry etching and the fourth raised field-oxide layers 303e between the pair of second sidewall dielectric spacers 321a in each of the common-drain regions are simultaneously etched to form a second flat bed; a planarized fifth conductive layer 322a is formed over the second flat bed between the pair of second sidewall dielectric spacers 321a in each of the common-drain regions. The second flat bed (see FIG. 4E) is alternately formed by a fifth raised field-oxide layer 303f and the shallow heavily-doped common-drain diffusion region 320b. The planarized fifth conductive layer 322a is preferably made of doped polycrystalline silicon. The planarized fifth conductive layer 322a can also be formed by first depositing a thin doped polycrystalline silicon layer and then implanting a high dose of doping impurities to act as a dopant diffusion source for forming the shallow heavily-doped drain diffusion region 320b of the second conductivity type within each of the common-drain diffusion regions 320a and then depositing a thick tungsten disilicide or tungsten film to fill up each gap; and subsequently, a planarization process is performed by using CMP or conventional etching-back. It should be noted that a barrier-metal layer such as a titanium nitride(TiN) or tantalum nitride(TaN) layer can be formed over the thin doped polycrystalline silicon layer before depositing the thick tungsten disilicide or tungsten film.

Figure 3L:
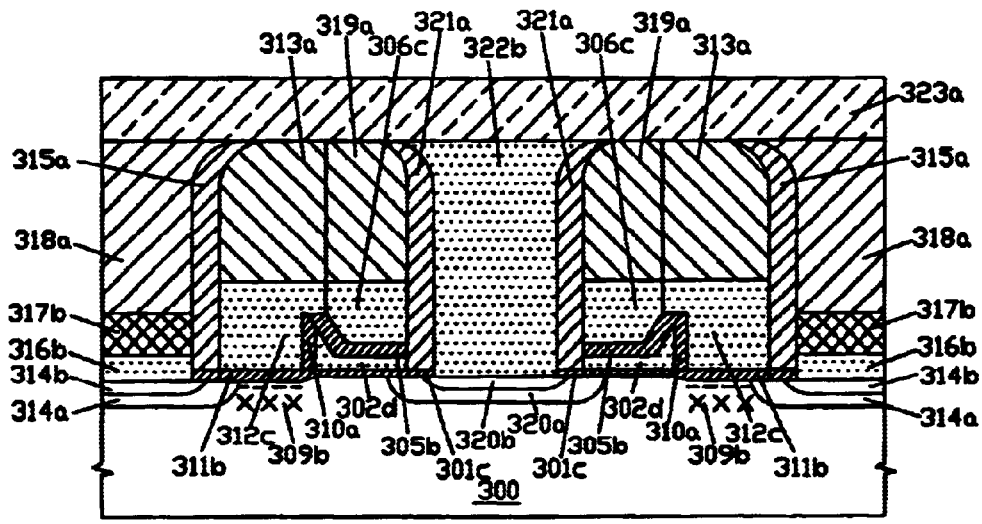

FIG. 3L shows that a first interconnect metal layer 323 being formed over a formed structure shown in FIG. 3K together with the planarized fifth conductive layers 322a are simultaneously patterned and etched to form a plurality of metal bit lines 323a integrated with a plurality of common-drain conductive islands 322b by using a plurality of hard masking layers, wherein each of the plurality of hard masking layers includes a second masking dielectric layer 324a being aligned above each of the plurality of active regions and a sidewall dielectric spacer 325a (as shown in FIG. 4B through FIG. 4E) being formed over each sidewall of the second masking dielectric layers 324a. The various cross-sectional views of FIG. 3L will be shown in FIG. 4B through FIG. 4E, respectively.

Figure 4A:
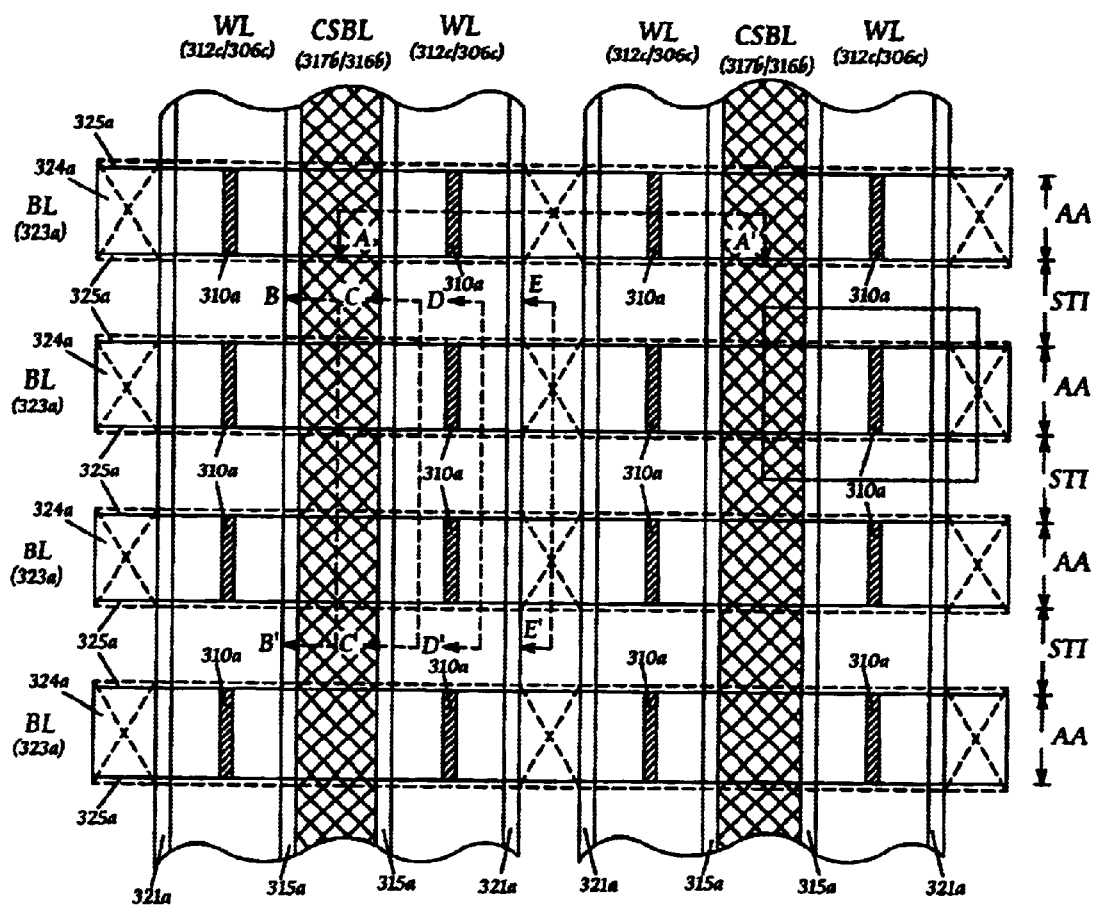

FIG. 4A shows a schematic top plan view of a contactless NOR-type flash memory array of the present invention, in which a cross-sectional view along a A–A' line is shown in FIG. 3L. As shown in FIG. 4A, the plurality of active regions (AA's) and the plurality of parallel STI regions (STI lines) are formed alternately on the semiconductor substrate 300 of the first conductivity type; the plurality of common-source conductive bus lines 317b/316b (CSBL) are formed alternately and transversely to the plurality of parallel STI regions, wherein each of the plurality of common-source conductive bus lines 317b/316b is formed over the first flat bed between the pair of first sidewall dielectric spacers 315a and the first flat bed is formed alternately by the third raised field-oxide layer 303d and the shallow heavily-doped common-source diffusion region 314b being formed within the common-source diffusion region 314a; the plurality of common-drain conductive islands 322b are formed alternately between the plurality of common-source conductive bus lines 317b/316b and over the second flat beds between the pair of second sidewall dielectric spacers 321a, wherein each of the second flat beds is alternately formed by the fifth raised field-oxide layer 303f and the shallow heavily-doped common-drain diffusion region 320b formed within the common-drain diffusion region 320a; the plurality of self-aligned split-gate flash memory cells are located between the plurality of common-source conductive bus lines 317b/316b and the plurality of common-drain conductive islands 322b; the plurality of metal bit lines 323a (BL) integrated with the plurality of common-drain conductive islands 322b are simultaneously patterned and etched to be perpendicular to the plurality of common-source conductive bus lines 317b/316b by using the plurality of hard masking layers, wherein each of the plurality of hard masking layers includes the second masking dielectric layer 324a being aligned above the active region (AA) and the sidewall dielectric spacer 325a being formed over each sidewall of the second masking dielectric layer 324a. The various cross-sectional views as indicated by a B–B' line, a C–C' line, a D–D' line, and a E–E' line as shown in FIG. 4A are shown in FIG. 4B through FIG. 4E, respectively.

Figures 4B, 4C:
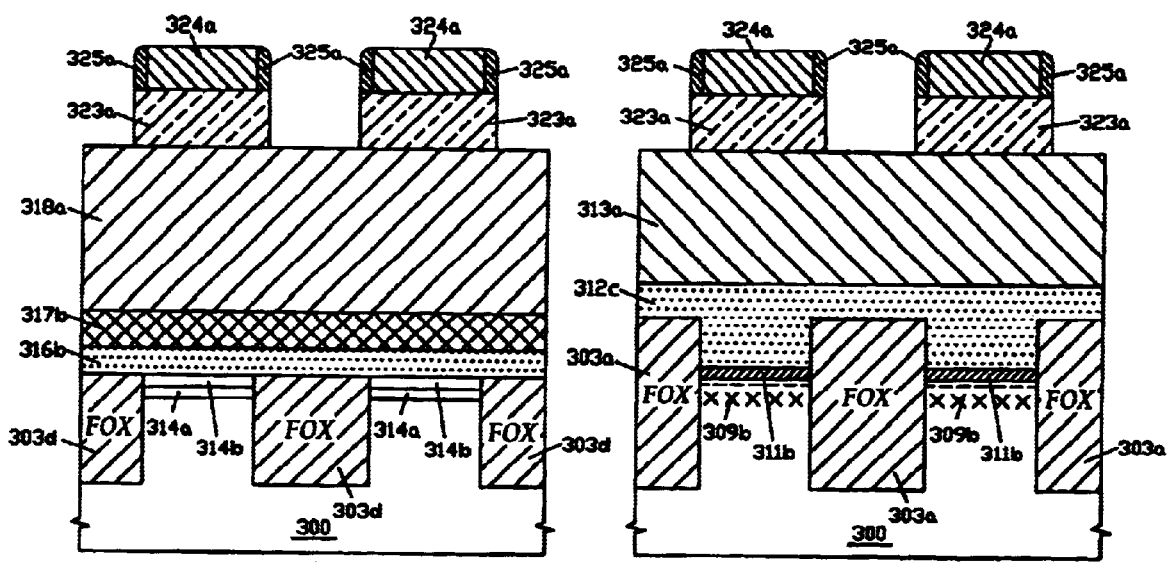

Referring now to FIG. 4B through FIG. 4E, there are shown various cross-sectional views as indicated in FIG. 4A. FIG. 4B shows a cross-sectional view along each of the common-source regions as indicated by a B–B' line shown in FIG. 4A, in which the common-source conductive bus line 317b/316b is formed over the first flat bed being alternately formed by the third raised field-oxide layer 303d and the shallow heavily-doped common-source diffusion region 314b being formed within the common-source diffusion region 314a; the first planarized thick-oxide layer 318a is formed over the common-source conductive bus line 317b/316b, and the plurality of metal bit lines 323a being patterned and etched by the plurality of hard masking layers as described are formed over the first planarized thick-oxide layer 318a.

FIG. 4C shows a cross-sectional view along each of the select-gate regions as indicated by a C–C' line shown in FIG. 4A, in which the planarized control/select-gate conductive layer 312c is alternately formed over the planarized field-oxide layer 303a and the second gate dielectric layer 311b; the third sidewall dielectric spacer 313a is formed over the select-gate conductive layer 312c; and the plurality of metal bit lines 323a being formed over the third sidewall dielectric spacer 313a are patterned and etched by the plurality of hard masking layers as described. The implanted region 309b of the first conductivity type being formed under the second gate dielectric layer 311b comprises a shallow implant region as indicated by the dashed line for threshold-voltage adjustment and a deep implant region as indicated by the cross symbols for forming a punch-through stop.

Figures 4D, 4E:
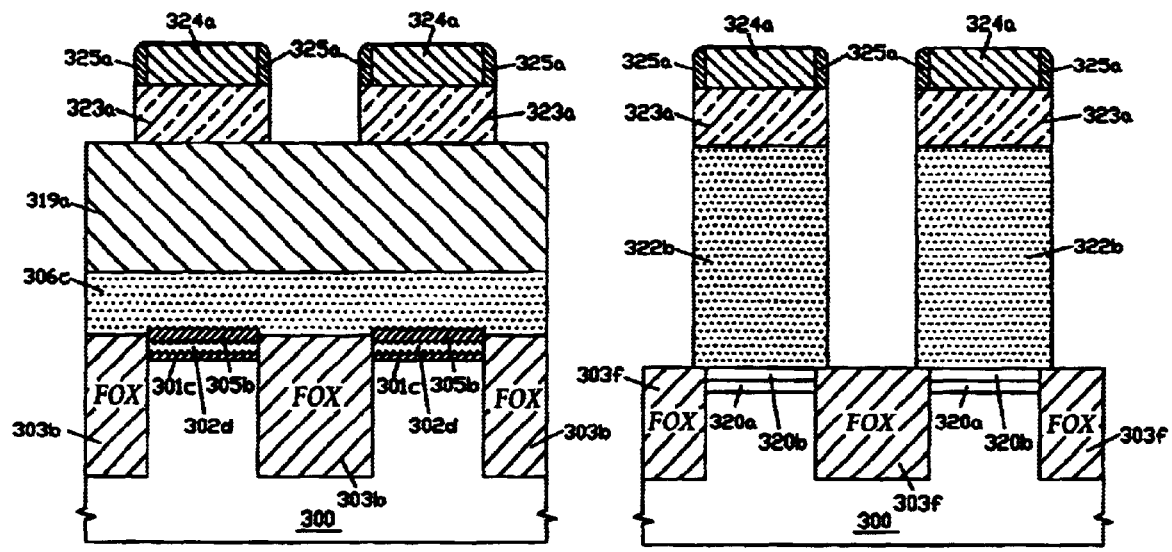

FIG. 4D shows a cross-sectional view along each of the floating-gate regions as indicated by a D–D' line shown in FIG. 4A, in which the first intergate dielectric layer 305b is formed over the floating-gate layer 302d; the planarized control/select-gate conductive layer 306c is alternately formed over the first raised field-oxide layer 303b and the first intergate dielectric layer 305b; the fourth sidewall dielectric spacer 319a is formed over the control-gate conductive layer 306c; and the plurality of metal bit lines 323a are patterned and etched by the plurality of hard masking layers as described.

FIG. 4E shows a cross-sectional view along each of the common-drain regions as indicated by a E–E' line shown in FIG. 4A, in which the plurality of metal bit lines 323a together with the plurality of common-drain conductive islands 322b are simultaneously patterned and etched by the plurality of hard masking layers as described, wherein each of the plurality of common-drain conductive islands 322b is at least formed over the shallow heavily-doped drain diffusion region 320b in the second flat bed. The second flat bed is alternately formed by the fifth raised field-oxide layer 303f and the shallow heavily-doped drain diffusion region 320b being formed within the common-drain diffusion region 320a. Each of the plurality of hard masking layers includes the second masking dielectric layer 324a being aligned above the active region and the sidewall dielectric spacer 325a being formed over each sidewall of the second masking dielectric layer 324a to eliminate misalignment.

Figure 5A:
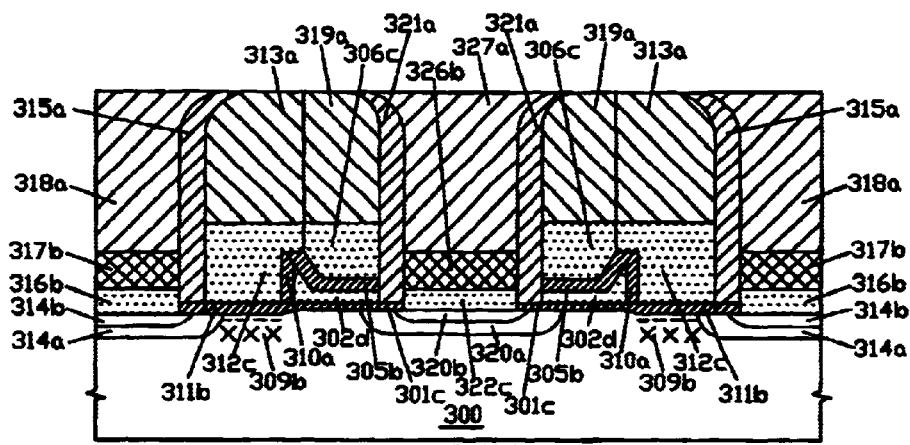
FIG. 5A through FIG. 5C show the process steps after FIG. 3K and their cross-sectional views of forming a self-aligned split-gate flash cell structure and its contactless parallel common-source/drain conductive bit-lines flash memory array of the present invention.
Figure 5B:
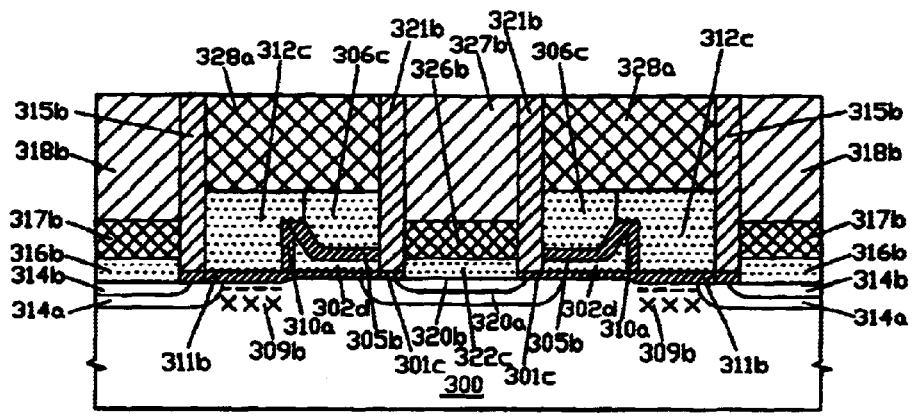
Figure 5C:
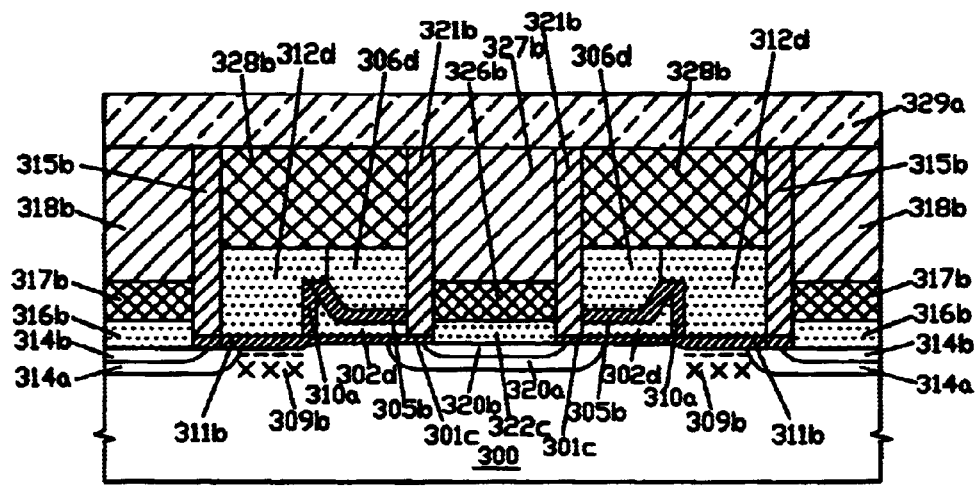

Referring now to FIG. 5A through FIG. 5C, there are shown the process steps after FIG. 3K and their cross-sectional views for forming a self-aligned split-gate flash cell structure and its contactless parallel common-source/drain conductive bit-lines flash memory array of the present invention.

FIG. 5A shows that the planarized fifth conductive layer 322a in each of the common-drain regions is etched back to form a common-drain conductive layer 322c; a common-drain capping conductive layer 326b is formed over each of the common-drain conductive layers 322c; and a second planarized thick-oxide layer 327a is formed over the common-drain capping conductive layer 326b and the pair of second sidewall dielectric spacers 321a in each of the common-drain regions. Similarly, the common-drain capping conductive layer 326b can be made by using the same process technique as discussed for the common-source capping conductive layer 317b. The second planarized thick-oxide layer 327a is preferably made of silicon dioxide, phosphosilicate glass (p-glass), or boro-phosphosilicate glass (BPSG) as deposited by LPCVD, HDPCVD, or PE CVD.

FIG. 5B shows that the curve portions of the first/second planarized thick-oxide layers 318a/327a and the first/second sidewall dielectric spacers 315a/321a being made of silicon dioxide are etched back first; the third/fourth sidewall dielectric spacers 313a/319a being made of silicon nitride are then removed by using hot-phosphoric acid or anisotropic dry etching; and subsequently, a planarized capping conductive layer 328a is formed over the control/select-gate conductive layers 312c/306c. The planarized capping conductive layer 328a is preferably made of tungsten disilicide (WSi$_2$) or tungsten (W).

FIG. 5C shows that a first interconnect metal layer 329 being formed over a flat surface shown in FIG. 5B together with the planarized capping conductive layers 328a, the select-gate conductive layers 306c, and the control-gate conductive layers 312c are simultaneously patterned and etched to form a plurality of metal word lines 329a and a plurality of planarized control/select-gate conductive islands 328b, 312d, 306d by using a plurality of hard masking layers (see FIG. 6B through FIG. 6E), wherein each of the plurality of hard masking layers includes a second masking dielectric layer 324a being aligned above the active region and a sidewall dielectric spacer 325a being formed over each sidewall of the second masking dielectric layer 324a. The various cross-sectional views will be shown in FIG. 6B through FIG. 6E, respectively.

Figure 6A:
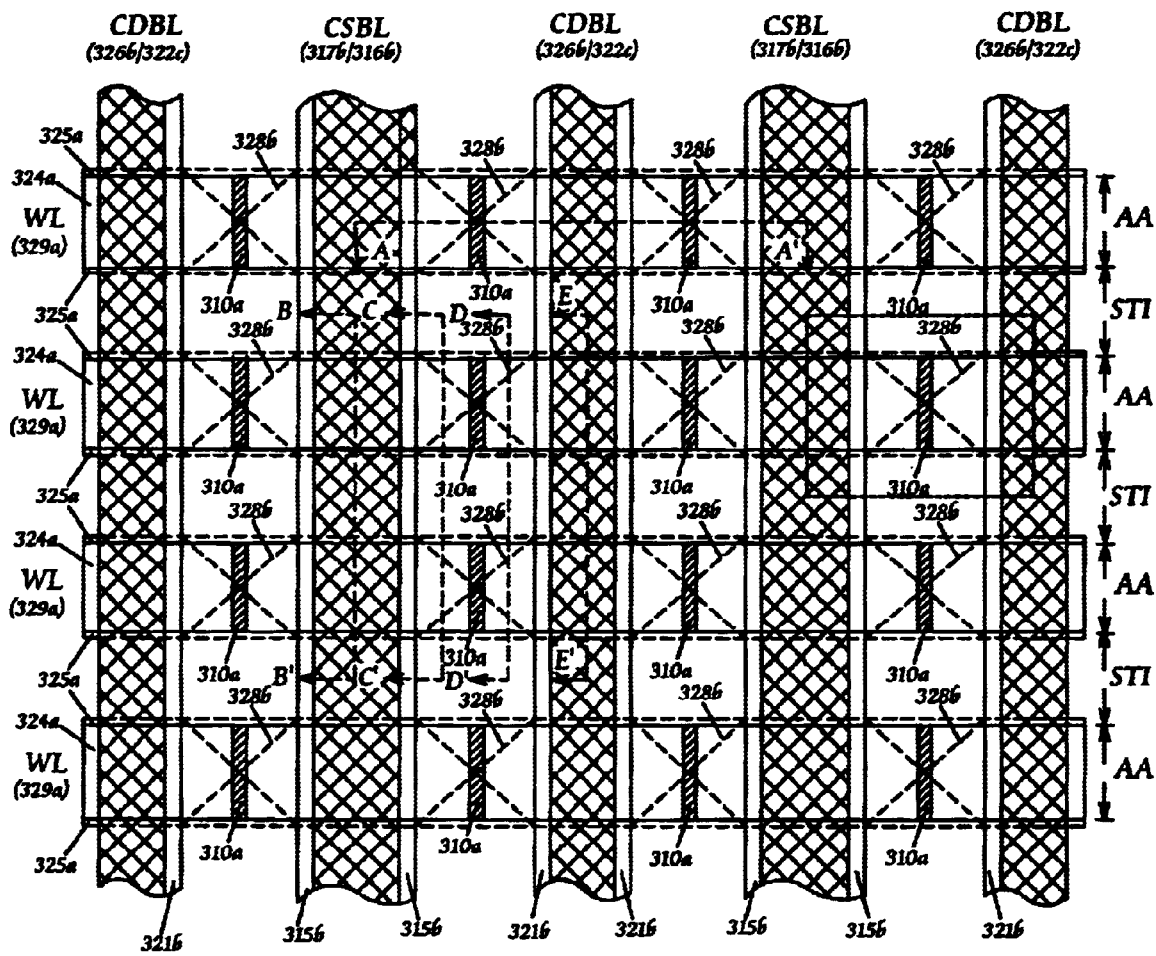

FIG. 6A shows a top plan view of a contactless parallel common-source/drain conductive bit-lines flash memory array of the present invention, in which the plurality of active regions (AA's) and the plurality of parallel STI regions (STI lines) are alternately formed over the semiconductor substrate 300 of the first conductivity type; the plurality of common-source conductive bus lines 317b/316b (CSBL) and the plurality of common-drain conductive bus lines 326b/322c (CDBL) are formed alternately and transversely to the plurality of parallel STI regions; the plurality of self-aligned split-gate flash memory cells are formed between each of the plurality of common-source conductive bus lines 317b/316b and its nearby common-drain conductive bus lines 326b/322c; and the plurality of metal word lines 329a (WL) integrated with the plurality of planarized control/select-gate conductive islands 328b, 312d, 306d are simultaneously patterned and etched to be perpendicular to the plurality of common-source/drain conductive bus lines 317b/316b, 326b/322c by using the plurality of hard masking layers, wherein each of the plurality of hard masking layers includes the second masking dielectric layer 324a being aligned above the active region and the sidewall dielectric spacer 325a being formed over each sidewall of the second masking dielectric layer 324a. Similarly, each of the plurality of common-source conductive bus lines 317b/316b is formed over the first flat bed between the pair of first sidewall dielectric spacers 315b and the first flat bed is alternately formed by the third raised field-oxide layer 303d and the shallow heavily-doped common-source diffusion region 314b formed within the common-source diffusion region 314a; each of the plurality of common-drain conductive bus lines 326b/322c is formed over the second flat bed between the pair of second sidewall dielectric spacers 321b and the second flat bed is alternately formed by the fifth raised field-oxide layer 303f and the shallow heavily-doped common-drain diffusion region 320b formed within the common-drain diffusion region 320a. The various cross-sectional views as indicated by a B–B' line, a C–C' line, a D–D' line, and a E–E' line shown in FIG. 6A are shown in FIG. 6B through FIG. 6E, respectively.

Figure 6B:
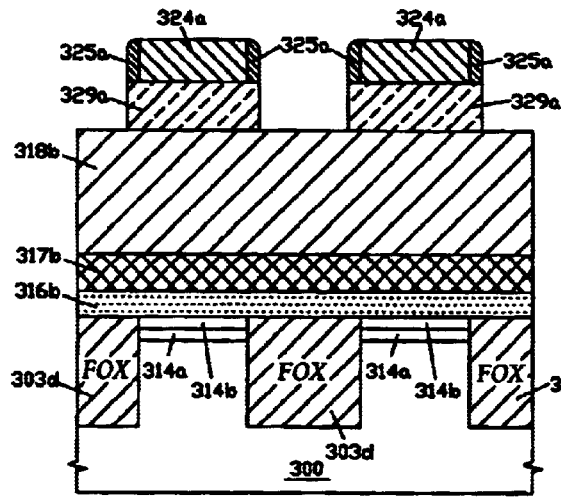

Referring now to FIG. 6B through FIG. 6E, there are shown various ross-sectional views shown in FIG. 6A. FIG. 6B shows a cross-sectional view along each of the common-source regions as indicated by a B–B' line shown in FIG. 6A, in which each of the plurality of common-source conductive bus lines 317b/316b is formed over the first flat bed; the first planarized thick-oxide layer 318b is formed over the common-source conductive bus line 317b/316b; and the plurality of metal word lines 329a being formed over the first planarized thick-oxide layer 318b are patterned and etched by the plurality of hard masking layers as described. The first flat bed is alternately formed by the third raised field-oxide layer 303d and the shallow heavily-doped common-source diffusion region 314b being formed within the common-source diffusion region 314a.

Figure 6C:
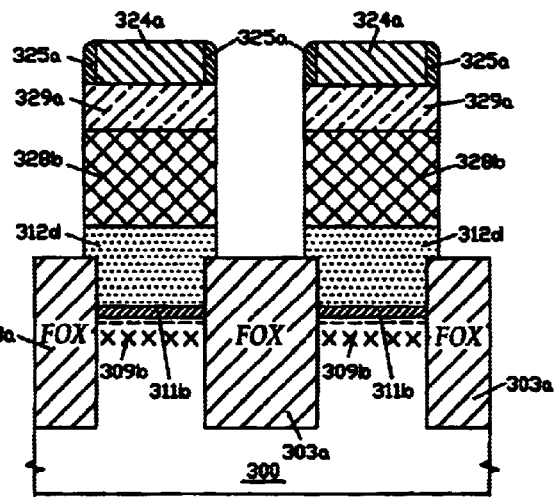

FIG. 6C shows a cross-sectional view along each of the select-gate regions as indicated by a C–C' line shown in FIG. 6A, in which the plurality of metal word lines 329a together with the plurality of planarized control/select-gate conductive islands 328b/312d are patterned and etched by the plurality of hard masking layers as described; and each of the planarized select-gate conductive islands 328b/312d is formed over the second gate dielectric layer 311b and a portion of nearby planarized field-oxide layers 303a. The implanted region 309b of the first conductivity type is formed under the second gate dielectric layer 311b between the nearby planarized field-oxide layers 303a, which comprises a shallow implant region as indicated by the dashed line for threshold-voltage adjustment and a deep implant region as indicated by the cross symbols for forming a punch-through stop.

Figure 6D:
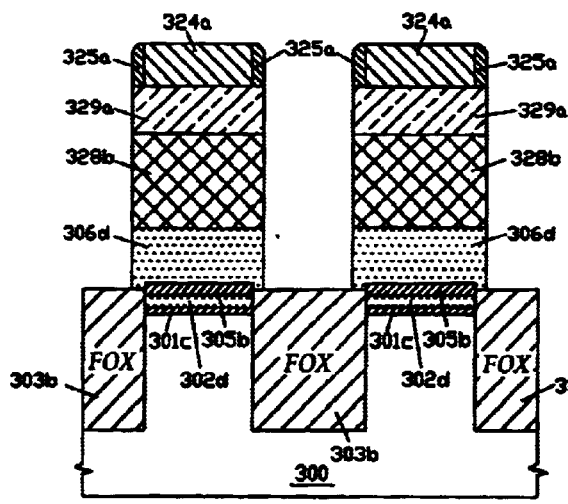

FIG. 6D shows a cross-sectional view along each of the floating-gate regions as indicated by a D–D' line shown in FIG. 6A, in which the plurality of metal word lines 329a together with the plurality of planarized control-gate conductive islands 328b, 306d being simultaneously patterned and etched by the plurality of hard masking layers as described are formed on the first intergate dielectric layers 305b and a portion of nearby first raised field-oxide layers 303b; the first intergate dielectric layer 305b is formed on the floating-gate layer 302d; and the floating-gate layer 302d is formed on the first gate dielectric layer 301c.

Figure 6E:
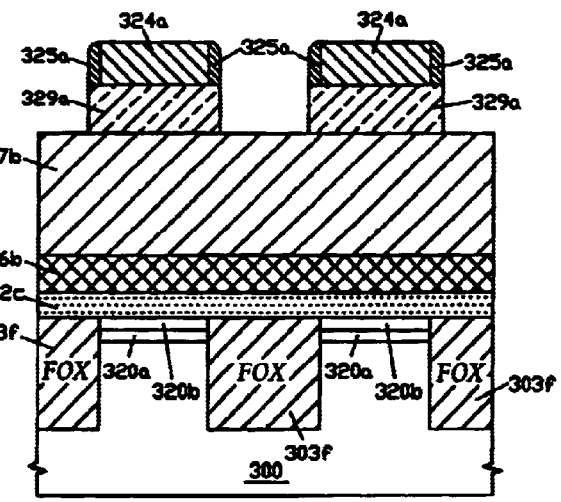

FIG. 6E shows a cross-sectional view along each of the common-drain regions as indicated by a E–E' line shown in FIG. 6A, in which each of the common-drain conductive bus lines 326b/322c is formed over the second flat bed; the second planarized thick-oxide layer 327b is formed over the common-drain conductive bus line 326b/322c; and the plurality of metal word lines 329a being formed over the second planarized thick-oxide layer 327b are patterned and etched by the plurality of hard masking layers as described. The second flat bed is alternately formed by the fifth raised field-oxide layer 303f and the shallow heavily-doped common-drain diffusion region 320b being formed within the common-drain diffusion region 320a.

From FIG. 4A and FIG. 6A, the width and the space of each of the plurality of parallel STI regions can be defined to be a minimum feature size(F) of technology used; a common-source region and a common-drain region are scalable and can be defined to be $\chi_1 F$ and $\chi_3 F$, respectively; and a split-gate region of a self-aligned split-gate flash memory cell can be defined to be $\chi_2 F$. It is clearly seen that $\chi_1, \chi_2$ and $\chi_3$ are the scaling factors and can be defined to be equal to unity, then the cell size as marked by a dashed square in FIG. 4A and FIG. 6A is equal to $4F^2$. Therefore, the cell size of the present invention can be fabricated to be smaller than $4F^2$ by controlling the scaling factors $\chi_1, \chi_2$ or $\chi_3$. It should be emphasized that the self-aligned split-gate flash memory cell of the present invention can be erased by the tip cathode formed by the ridge-shaped floating-gate structure with a higher field-emission efficiency due to a higher coupling ratio of the self-aligned structure used in the present invention.

Accordingly, the major advantages and features of the present invention are summarized below:
(a) The self-aligned split-gate flash cell structure of the present invention can be made to have a scalable cell size smaller than $4F^2$.
(b) The self-aligned split-gate flash cell structure of the present invention can be erased with a higher field-emission efficiency through a ridge-shaped floating-gate structure.
(c) The two contactless flash memory arrays of the present invention offer a highly common-source conductive bus line over the common-source diffusion regions with smaller bus-line resistance and smaller bus-line capacitance with respect to the semiconductor substrate as compared to those of the buried diffusion layer of the prior art.
(d) The contactless NOR-type flash memory array of the present invention offers a metal bit line being integrated with common-drain conductive islands with lower bit-line resistance.
(e) The contactless parallel common-source/drain conductive bit-lines flash memory array of the present invention offers a highly conductive layer for both common-source conductive bus line and common-drain conductive bus line with smaller bus-line resistance and smaller bus-line capacitance with respect to the semiconductor substrate.

(f) The contactless parallel common-source/drain conductive bit-lines flash memory array of the present invention offers a metal word line being integrated with planarized control/select-gate conductive islands with lower word-line resistance.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A self-aligned split-gate flash cell structure, comprising:
   a semiconductor substrate of a first conductivity type having an active region formed between two parallel shallow trench isolation (STI) regions:
   a cell region comprising a common-source region, a self-aligned split-gate region, and a common-drain region, wherein said self-aligned split-gate region is formed between said common-source region and said common-drain region;
   said common-source region being formed in a first side portion of said self-aligned split-gate region comprising a common-source diffusion region of a second conductivity type being formed in a surface portion of said semiconductor substrate in said active region, a first sidewall dielectric spacer being formed over a first sidewall of said self-aligned split-gate region, and a first flat bed being formed outside of said first sidewall dielectric spacer, wherein said first flat bed is formed by said common-source diffusion region in said active region and two third raised field-oxide layers in said two parallel STI regions;
   said common-drain region being formed in a second side portion of said self-aligned split-gate region comprising a common-drain diffusion region of said second conductivity type being formed in a surface portion of said semiconductor substrate in said active region, a second sidewall dielectric spacer being formed over a second sidewall of said self-aligned split-gate region, and a second flat bed being formed outside of said second sidewall dielectric spacer, wherein said second flat bed is formed by said common-drain diffusion region in said active region and two fifth raised field-oxide layers in said two parallel STI regions;
   said self-aligned split-gate region comprising a floating-gate region being defined by a fourth sidewall dielectric spacer near said common-drain region and a select-gate region being defined by a third sidewall dielectric spacer near said common-source region, wherein said floating-gate region comprises a floating-gate structure being formed over a first gate dielectric layer in said active region and a control-gate conductive layer or a planarized control-gate conductive island being formed over said floating-gate structure and said select-gate region comprises a select-gate conductive layer or a planarized select-gate conductive island being at least formed over a second gate dielectric layer in said active region; and
   said floating-gate structure comprising a ridge-shaped floating-gate layer with a second thermal poly-oxide layer being formed over its inner sidewall near said select-gate region and a first thermal poly-oxide layer being formed over its top portion.

2. The self-aligned split-gate flash cell structure according to claim 1, wherein said common-source conductive bus line comprising a doped polycrystalline silicon layer being implanted with a high dose of doping impurities of said second conductivity type and capped with a tungsten disilicide ($WSi_2$) or tungsten (W) layer is formed over said first flat bed outside of said first sidewall dielectric spacer and a first planarized thick-oxide layer is formed over said common-source conductive bus line.

3. The self-aligned split-gate flash cell structure according to claim 1, wherein said control/select-gate conductive layer comprising a doped polycrystalline silicon layer or a doped polycrystalline silicon layer capped with a tungsten disilicide ($WSi_2$) or tungsten (W) layer is acted as a conductive word-line to form said self-aligned split-gate flash cell structure for a contactless NOR-type flash memory array.

4. The self-aligned split-gate flash cell structure according to claim 1, wherein said planarized control/select-gate conductive island comprises a doped polycrystalline silicon island capped with a tungsten disilicide ($WSi_2$) or tungsten (W) layer and a metal word-line integrated with said planarized control/select-gate conductive island are simultaneously patterned by a hard masking dielectric layer being aligned above said active region and a sidewall dielectric spacer being formed over each sidewall of said hard masking dielectric layer to form said self-aligned split-gate flash cell structure for a contactless parallel common-source/drain bit-lines flash memory array.

5. The self-aligned split-gate flash cell structure according to claim 1, wherein a common-drain conductive island comprising a doped polycrystalline silicon island is formed at least over said common-drain diffusion region in said second flat bed and a metal bit line integrated with said common-drain conductive island are simultaneously patterned by a hard masking dielectric layer being aligned above said active region and a sidewall dielectric spacer being formed over each sidewall of said hard masking dielectric layer to form said self-aligned split-gate flash cell structure for a contactless NOR-type flash memory array.

6. The self-aligned split-gate flash cell structure according to claim 1, wherein a common-drain conductive bus line comprising a doped polycrystalline silicon layer capped with a tungsten disilicide ($WSi_2$) or tungsten (W) layer is formed over said second flat bed outside of said second sidewall dielectric spacer and a second planarized thick-oxide layer is formed over said common-drain conductive bus line to form said self-aligned split-gate flash cell structure for a contactless parallel common-source/drain bit-lines flash memory array.

7. The self-aligned split-gate flash cell structure according to claim 1, wherein said common-source diffusion region comprises a shallow heavily-doped common-source diffusion region being formed within a lightly-doped common-source diffusion region and said common-drain diffusion region comprises a shallow heavily-doped common-drain diffusion region being formed within a lightly-doped common-drain diffusion region.

8. The self-aligned split-gate flash cell structure according to claim 1, wherein an implant region of said first conductivity type being formed under said second gate dielectric layer in said select-gate region comprises a shallow implant region for threshold-voltage adjustment and a deep implant region for forming a punch-through stop.

9. A contactless NOR-type flash memory array, comprising:
- a semiconductor substrate of a first conductivity type having a shallow trench isolation (STI) structure, wherein said STI structure comprises a plurality of active regions and a plurality of parallel STI regions being alternately formed on said semiconductor substrate;
- a plurality of first virtual-gate regions and a plurality of second virtual-gate regions being alternately formed on said STI structure and transversely to the plurality of active regions, wherein each of the plurality of first virtual-gate regions comprises a pair of floating-gate regions being defined by a pair of fourth sidewall dielectric spacers formed over outer sidewalls of nearby second virtual-gate regions and a common-drain region being formed between said pair of floating-gate regions and each of the plurality of second virtual-gate regions comprises a pair of select-gate regions being defined by a pair of third sidewall dielectric spacers formed over outer sidewalls of nearby first virtual-gate regions and a common-source region being formed between said pair of select-gate regions;
- said common-source region comprising a plurality of common-source diffusion regions of a second conductivity type being formed in surface portions of said semiconductor substrate in the plurality of active regions, a pair of first sidewall dielectric spacers being formed over outer sidewalls of nearby select-gate regions, and a first flat bed being alternately formed by said common-source diffusion region and a third raised field-oxide layer between said pair of first sidewall dielectric spacers, wherein a common-source conductive bus line is formed over said first flat bed and a first planarized thick-oxide layer is formed over said common-source conductive bus line between said pair of first sidewall dielectric spacers;
- said common-drain region comprising a plurality of common-drain diffusion regions of said second conductivity type being formed in surface portions of said semiconductor substrate in the plurality of active regions, a pair of second sidewall dielectric spacers being formed over outer sidewalls of nearby floating-gate regions, and a second flat bed being alternately formed by said common-drain diffusion region and a fifth raised field-oxide layer between said pair of second sidewall dielectric spacers, wherein a plurality of common-drain conductive islands are at least formed over the plurality of common-drain diffusion regions in said second flat bed;
- each of said pair of floating-gate regions comprising a plurality of floating-gate structures being separately formed over a plurality of first gate dielectric layers in the plurality of active regions and a portion of each control-gate conductive layer being formed over the plurality of floating-gate structures in the plurality of active regions and a plurality of planarized field-oxide layers in the plurality of parallel STI regions, wherein each of the plurality of floating-gate structures comprises a second thermal poly-oxide layer being formed over its inner sidewall and a first thermal poly-oxide layer being formed over its top portion;
- each of said pair of select-gate regions comprising a select-gate conductive layer being at least formed over a plurality of second gate dielectric layers in the plurality of active regions and a plurality of first raised field-oxide layers in the plurality of parallel STI regions; and
- a plurality of metal bit lines integrated with said common-drain conductive islands being simultaneously patterned by a masking step, wherein said masking step comprises a plurality of hard masking dielectric layers being separately aligned above the plurality of active regions and a sidewall dielectric spacer being formed over each sidewall of the plurality of hard masking dielectric layers.

10. The contactless NOR-type flash memory array according to claim 9, wherein said control/select-gate conductive layer comprises a doped polycrystalline silicon layer or a doped polycrystalline silicon layer capped with a tungsten disilicide ($WSi_2$) or tungsten (W) layer.

11. The contactless NOR-type flash memory array according to claim 9, wherein said common-drain conductive island comprises a doped polycrystalline silicon island silicided with a refractory metal-disilicide layer and said metal bit line comprises a copper (Cu) or aluminum (Al) layer being formed over a barrier metal layer.

12. The contactless NOR-type flash memory array according to claim 9, wherein said common-source conductive bus line comprises a doped polycrystalline silicon layer capped with a tungsten disilicide ($WSi_2$) or tungsten (W) layer.

13. The contactless NOR-type flash memory array according to claim 9, wherein an implant region of said first conductivity type being formed under said second gate dielectric layer comprises a shallow implant region for threshold-voltage adjustment and a deep implant region for forming a punch-through stop.

14. A contactless parallel common-source/drain bit-lines flash memory array, comprising:
- a semiconductor substrate of a first conductivity type having a shallow trench isolation (STI) structure, wherein said STI structure comprises a plurality of active regions and a plurality of parallel STI regions being alternately formed on said semiconductor substrate;
- a plurality of first virtual-gate regions and a plurality of second virtual-gate regions being alternately formed on said STI structure and transversely to the plurality of active regions, wherein each of the plurality of first virtual-gate regions comprises a pair of floating-gate regions being defined by a pair of fourth sidewall dielectric spacers formed over outer sidewalls of nearby second virtual-gate regions and a common-drain region being formed between said pair of floating-gate regions and each of the plurality of second virtual-gate regions comprises a pair of select-gate regions being defined by a pair of third sidewall dielectric spacers formed over outer sidewalls of nearby first virtual-gate regions and a common-source region being formed between said pair of select-gate regions;
- said common-source region comprising a plurality of common-source diffusion regions of a second conductivity type being formed in surface portions of said semiconductor substrate in the plurality of active regions, a pair of first sidewall dielectric spacers being formed over outer sidewalls of nearby select-gate regions, and a first flat bed being alternately formed by said common-source diffusion region and a third raised field-oxide layer between said pair of first sidewall dielectric spacers, wherein a common-source conductive bus line is formed over said first flat bed and a first planarized thick-oxide layer is formed over said common-source conductive bus line between said pair of first sidewall dielectric spacers;

said common-drain region comprising a plurality of common-drain diffusion regions of said second conductivity type being formed in surface portions of said semiconductor substrate in the plurality of active regions, a pair of second sidewall dielectric spacers being formed over outer sidewalls of nearby floating-gate regions, and a second flat bed being alternately formed by said common-drain diffusion region and a fifth raised field-oxide layer between said pair of second sidewall dielectric spacers, wherein a common-drain conductive bus line is formed over said second flat bed and a second planarized thick-oxide layer is formed over said common-drain conductive bus line between said pair of second sidewall dielectric spacers;

each of said pair of floating-gate regions comprising a plurality of floating-gate structures being separately formed over a plurality of first gate dielectric layers in the plurality of active regions and each of control-gate conductive islands being at least formed over each of the plurality of floating-gate structures in the plurality of active regions, wherein each of the plurality of floating-gate structures comprises a second thermal poly-oxide layer being formed over its inner sidewall and a first thermal poly-oxide layer being formed over its top portion;

each of said pair of select-gate regions comprising a plurality of select-gate conductive islands being at least formed over a plurality of second gate dielectric layers in the plurality of active regions;

a planarized capping conductive island being formed over each of said control/select-gate conductive islands; and a plurality of metal word lines integrated with said planarized capping conductive islands over said control/select-gate conductive islands being simultaneously patterned by a masking step, wherein said masking step comprises a plurality of hard masking dielectric layers being separately aligned above the plurality of active regions and a sidewall dielectric spacer being formed over each sidewall of the plurality of hard masking dielectric layers.

15. The contactless parallel common-source/drain bit-lines flash memory array according to claim 14, wherein said common-source conductive bus line comprises a doped polycrystalline silicon layer capped with a tungsten disilicide ($WSi_2$) or tungsten (W) layer.

16. The contactless parallel common-source/drain bit-lines flash memory array according to claim 14, where said common-drain conductive bus line comprises a doped polycrystalline silicon layer capped with a tungsten disilicide ($WSi_2$) or tungsten (W) layer.

17. The contactless parallel common-source/drain bit-lines flash memory array according to claim 14, wherein said control/select-gate conductive island comprises a doped polycrystalline silicon island and said planarized capping conductive island comprises a tungsten disilicide ($WSi_2$) or tungsten (W) island.

18. The contactless parallel common-source/drain bit-lines flash memory array according to claim 14, wherein said metal word line comprises a copper (Cu) or aluminum (Al) layer being formed over a barrier-metal layer.

19. The contactless parallel common-source/drain bit-lines flash memory array according to claim 14, wherein an implant region of said first conductivity type being formed under said second gate dielectric layer comprises a shallow implant region for threshold-voltage adjustment and a deep implant region for forming a punch-through stop.

20. The contactless parallel common-source/drain bit-lines flash memory array according to claim 14, wherein said common-source/drain diffusion region comprises a shallow heavily-doped common-source/drain diffusion region being formed within a lightly-doped common-source/drain diffusion region.

* * * * *